United States Patent
Itani

(10) Patent No.: US 6,168,900 B1
(45) Date of Patent: Jan. 2, 2001

(54) CHEMICALLY AMPLIFIED RESIST

(75) Inventor: Toshiro Itani, Tokyo (JP)

(73) Assignee: NEC Corporation (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/036,995

(22) Filed: Mar. 9, 1998

(30) Foreign Application Priority Data

Mar. 13, 1997 (JP) .................................................. 9-059150

(51) Int. Cl.[7] .................................................. G03F 7/004
(52) U.S. Cl. ........................................ 430/270.1; 430/905
(58) Field of Search ................................ 430/270.1, 905

(56) References Cited

U.S. PATENT DOCUMENTS

| | | | |
|---|---|---|---|
| 5,736,296 | * | 4/1998 | Sato et al. ......................... 430/270.1 |
| 5,744,281 | * | 4/1998 | Niki et al. ......................... 430/270.1 |
| 5,750,309 | * | 5/1998 | Hatakeyama et al. ............... 430/170 |
| 5,770,343 | * | 6/1998 | Sato et al. ......................... 430/170 |
| 5,817,444 | * | 10/1998 | Sato et al. ......................... 526/313 |
| 5,844,057 | * | 12/1998 | Watanabe et al. .................. 430/155 |
| 5,948,589 | * | 9/1999 | Sato et al. ......................... 430/270.1 |
| 5,955,240 | * | 9/1999 | Sato et al. ......................... 430/270.1 |
| 5,976,759 | * | 11/1999 | Urano et al. ....................... 430/270.1 |

FOREIGN PATENT DOCUMENTS

| | | | |
|---|---|---|---|
| 580516 | 4/1993 | (JP) | ............................... G03F/7/039 |
| 7134419 | 5/1995 | (JP) | ............................... G03F/7/039 |
| 8160622 | 6/1996 | (JP) | ............................... G03F/7/039 |
| 8337616 | 12/1996 | (JP) | ............................... G08F/12/22 |
| 922117 | 1/1997 | (JP) | ............................... G03F/7/039 |
| 9222732 | 8/1997 | (JP) | ............................... G03F/7/039 |
| 1020504 | 1/1998 | (JP) | ............................... G03F/7/039 |
| 1031309 | 2/1998 | (JP) | ............................... G03F/1/039 |
| 1048826 | 2/1998 | (JP) | ............................... G03F/7/039 |
| 1090902 | 4/1998 | (JP) | ............................... G03F/7/039 |
| 1097074 | 4/1998 | (JP) | ............................... G03F/7/039 |

* cited by examiner

Primary Examiner—John S. Chu
(74) Attorney, Agent, or Firm—Hayes, Soloway, Hennessey, Grossman & Hage

(57) ABSTRACT

To provide chemically amplified resist which is excellent in resolution, focusing and size accuracy as well by preventing problem of T-shaped resist pattern and reinforcing exposure dependence of solution speed, a mixture of t-BOC protected polyhydroxystyrene polymers having different molecular weight are used as a basic polymer of chemically amplified resist together with PAG. Preferable molecular-weight ratio and mixing ratio of the mixture are 1:5 to 1:20, and 10 to 30 parts by weight of low molecular-weight polymer to 100 parts of high molecular-weight polymer, respectively.

2 Claims, 2 Drawing Sheets

CHEMICALLY AMPLIFIED RESIST

BACKGROUND OF THE INVENTION

The present invention relates to chemically amplified resist including a polyhydroxystyrene polymer having a protection group whereof polarity is changed by acid catalyst and a photoacid generator, which is usable as positive resist, for example, to be applied to pattern formation wherein the positive resist is formed on a semiconductor substrate, exposed to KrF excimer laser light projected through a mask or a reticle, processed with PEB (Post Exposure Bake), and developed with a developer.

In conventional photolithograply technique, solubility-suppressed positive resist has been prevalent wherein novolac polymer is used as a base polymer added with naphthoquinonediazido as a photosensitive to be exposed to g-ray (436 nm) or i-ray (365 nm). However, lithography applying far ultraviolet rays such as excimer laser light of 248 nm or 193 nm has become required along with advances of fine integration of semiconductor circuits. As for the excimer laser light, the above conventional resist is not convenient because of its too strong photo-absorption to obtain a good resist pattern together with its too amplified photosensitivity. Hence, chemically amplified resist making use of sensitization of acid catalyst obtained from a photo-acid generator (hereafter abbreviated as PAG) is proposed and is being adopted as a resist material for short-wave lithography or electron-beam lithography requiring high sensitivity.

However, the above conventional chemically amplified resist has a problem that acid generated by the exposure may vanish from surface of the resist film or made inactive neutralized by bases in atmosphere. Hence, an insoluble surface layer is generated, wherein solubilization does not proceed in following PEB process, resulting in a T-shaped resist pattern 402 developed on a wafer 401, as schematically illustrated in FIG. 4. This phenomenon is often seen in high-resolution resist having a high solution-speed ratio (solubility contrast) between exposed part and unexposed part.

This T-shaped resist pattern is fatal especially for fine pattern configuration, degrading resolution, focusing and size accuracy.

For resolving this problem, in chemically amplified resist disclosed in a Japanese patent application laid open as a Provisional Publication No. 80516/'93, alkali-soluble groups such as a hydroxyl group, a carboxyl group, a methoxy group, or an anhydride group are introduced in the polymer intending to prevent the T-shaped resist pattern by controlling solution speed of the resist material. With this resist material, even though generation of the T-shaped resist pattern may be somewhat restrained, there arises another problem that upper edges of cross-sectional pattern become rounded and rectangularity of the resist pattern is spoiled, resulting also in degradation of the resolution.

SUMMARY OF THE INVENTION

Therefore, primary objects of the present invention is to provide chemically amplified resist which is excellent in resolution, focusing and size accuracy as well, preventing the T-shaped resist pattern by suppressing generation of the surface insoluble layer owing to the acid-intactivation at the resist surface, and to provide the chemically amplified resist giving, at the same time, a sharp gradient to the solubility characteristic (exposure dependence of the solution speed), by resolving the above problems of the prior art.

In order to achieve the object, in chemically amplified resist of the invention comprising a first polyhydroxystyrene polymer having a first protection group whereof polarity is changed by acid catalyst and a photoacid generator; a second polyhydroxystyrene polymer of different average molecular weight, having a second protection group whereof polarity is changed by acid catalyst, is mixed with the first polyhydroxystyrene polymer.

Generally, polymers of low molecular weight give high solution speed. Therefore, by adding the low molecular weight polymers, solution speed of low exposure area can be made high. Making use of this phenomenon, the solution speed is controlled by applying a mixture of protected polyhydroxystyrene polymers of different molecular weight to the base polymer, in the chemically amplified resist of the invention. When the solution speed is made high, the insoluble layer generated on the surface of the resist pattern can be eliminated, film surface being somewhat solved by the developer. Thus, the T-shaped resist pattern can be prevented. Further, making use of the low molecular weight polymer functioning to make the solution reaction uniform in a depth direction, the gradient of solubility characteristic, which is most important for the resist resolution, is reinforced in the invention, realizing still high resolution.

BRIEF DESCRIPTION OF THE DRAWINGS

The foregoing, further objects, features, and advantages of this invention will become apparent from a consideration of the following description, the appended claims, and the accompanying drawings wherein:

DETAILED DESCRIPTION OF THE PREFERRED EMBODIMENTS

Figure 1:
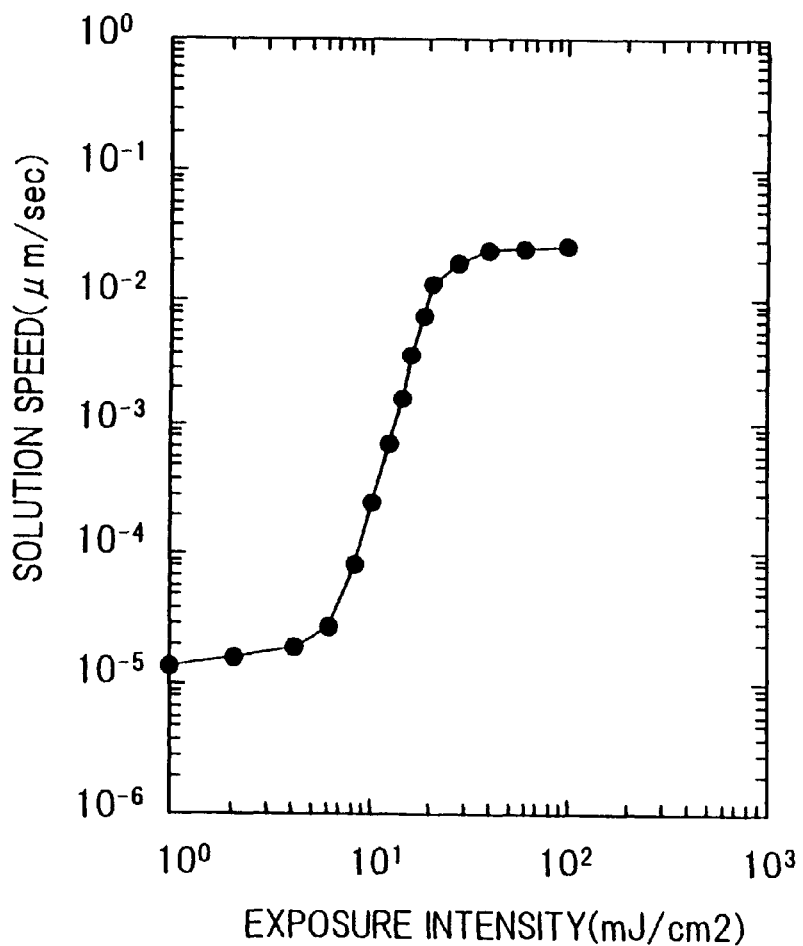
FIG. 1 is a graphic chart, illustrating exposure dependence of resist solution speed of a first example of chemically amplified resist according to an embodiment of the invention.

Now, at preferred embodiment of the present invention will be described.

In chemically amplified resist of the invention, a polyhydroxystyrene polymer having a protection group whereof polarity is changed by acid catalyst is used for a base polymer, and for the protected polyhydroxystyrene polymer, at mixture of polymers of different average molecular weight is applied. That is, a mixture of the protected polyhydroxystyrene polymer having comparatively high average molecular weight (hereafter called the high molecular-weight polymer) and that having comparatively low molecular weight (called the low molecular-weight polymer) is used for the base polymer of the invention. Number of kinds of the protected polyhydroxystyrene polymers consisting the base mixture is not limited. However, they are represented by a kind of high molecular-weight polymer and a kind of low molecular-weight polymer in the following description.

The mixture rate of the low molecular-weight polymer is preferably 10 to 30 parts by weight to 100 parts by weight of the high molecular-weight polymer.

As to difference of the average molecular weight, it may be prepared to be sufficiently large for giving at least one of the objects previously described. However, a preferable molecular weight ratio between the low molecular-weight polymer and the high molecular-weight polymer is between 1:5 and 1:20, and a preferable average molecular-weight of the high molecular-weight polymer is between 8,000 and 30,000, while that of the low molecular-weight polymer is between 400 and 6,000. Here, the average molecular weight is expressed by styrene-conversion measured by GPC (Gas Permeation Chromatography).

As above described, each of the low and the high molecular-weight polymer may be still a mixture of polymers of different average molecular weight. Further, as to the protection group of each component polymer of the mixture, the same or different kind protection group can be applied with each other selected among well-known conventional protection groups.

As a preferable example of the polyhydroxystyrene polymer having the protection group whereof polarity is changed by acid catalyst, there is a polyhydroxystyrene polymer having a t-BOC (t-butoxycarbonyl) group as the protection group, which is represented by following formula (1);

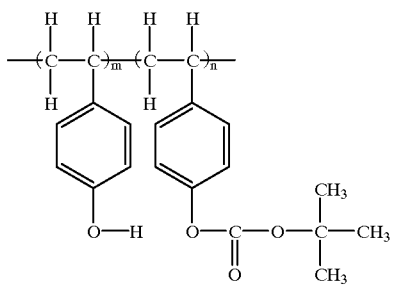

(1)

wherein, molecular-weight ratio n:m is preferable to be 25:75 to 45:55.

Another preferable example is a polyhydroxystyrene polymer having a THP (tetrahydropyranyl) group as the protection group, represented by following formula (2). Furthermore, a polyhydroxystyrene polymer without protection group such as represented by following formula (3) may be used together with above protected polyhydroxystyrene polymers.

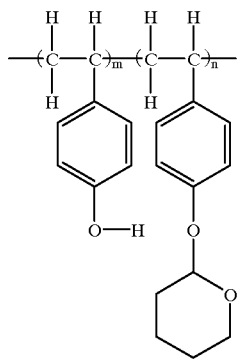

(2)

-continued

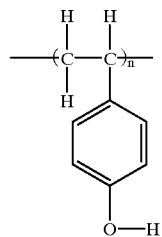

(3)

It is to be noted, here, that each of these polymers has different solubility to alkali developer with each other, giving different effect to the resolution or the cross-sectional pattern of the resist. Therefore, it is preferable to select appropriate kind or kinds, molecular-weight rate, mixture rate and protection coefficient of the mixture composing the base polymer. In other words, by selecting these factors appropriately, the resolution can be still improved by making sufficiently sharp the gradient of the solubility characteristic which is most important for the resolution.

Heretofore, a most characteristic feature of the embodiment is described.

As to a PAG to be added to the chemically amplified resist, conventional PAGs such as onium salt, triphenylsulfoniumhexafluoroantimonene or disulfonyldiazomethane PAG, for example, may be applied, kind and amount thereof being determined in accordance with the purpose. In general, 1 to 10 parts by weight of PAG are added to 100 parts by weight of the base polymer.

Further, to the chemically amplified resist of the invention, a cross-linking agent or other additive material may be added optionally.

In the following paragraphs, some examples and experimental results of the embodiment are described.

As a first example of the embodiment, a liquid of the chemically amplified resist for KrF excimer laser is prepared, wherein comprised a mixture of 100 parts by weight of t-BOC protected polyhydroxystyrene polymer of 20,000 average molecular weight and 20 parts by weight of t-BOC protected polyhydroxystyrene polymer of 2,000 average molecular weight as the base polymer, 5 parts by weight of onium salt (or triphenylsulfoniumhexafluoroantimonene) as the PAG, and 80 parts by weight of PGMEA (polypropyleneglycolmonomethyletheracetate) as the solvent.

This chemically amplified resist liquid is applied on a silicon wafer with a thickness of 0.7 μm, which is exposed to KrF excimer laser of 248 nm focused through a mask, processed with PEB of 100°for 90 sec., and developed with alkali developer, and a positive resist pattern with lines of 0.22 μm width is obtained.

FIG. 1 is at graphic chart illustrating exposure dependence of resist solution speed of the first example, that is, relation between solution speed of the resist to a developer and exposure intensity. As seen in FIG. 1, a higher solution speed and a more sharp gradient of the solubility characteristic are obtained than those of a comparison example of FIG. 3 composed of a single t-BOC protected polyhydroxystyrene polymer, which will be described afterwards.

Figure 2:
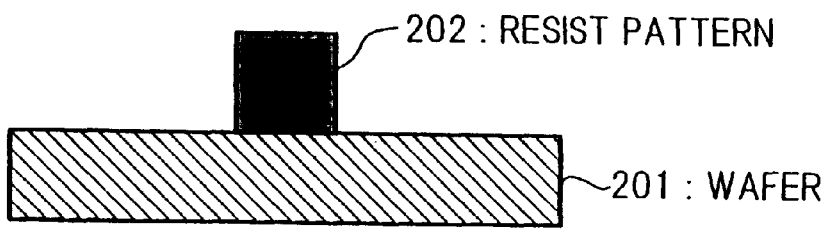
FIG. 2 is a cross section schematically illustrating the positive resist pattern obtained with the first example.

FIG. 2 is it cross section schematically illustrating the positive resist pattern thus obtained with the first example of the chemically amplified resist according to the embodiment, wherein a rectangular resist pattern 202 developed on a wafer 201 is realized with excellent resolution and size accuracy. That is, about 10% improvement is obtained both in the resolution and the size accuracy compared to the following comparison example.

As a comparison example, preparing chemically amplified resist liquid having the same composition with the first example of the embodiment except that 120 parts by weight of a protected polyhydroxystyrene polymer of 20,000 molecular weight is used for the sole base polymer, a positive resist pattern is configured in the same way.

Figure 3:
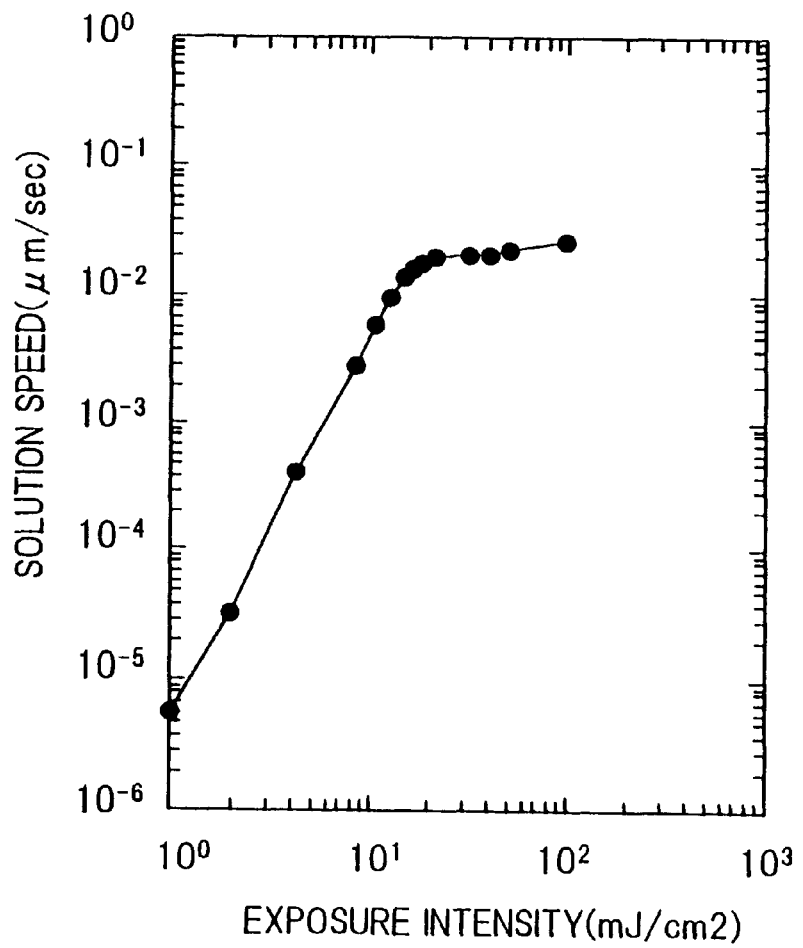
FIG. 3 is a graphic chart illustrating exposure dependence of resist solution speed of a comparison example of a prior art.
Figure 4:
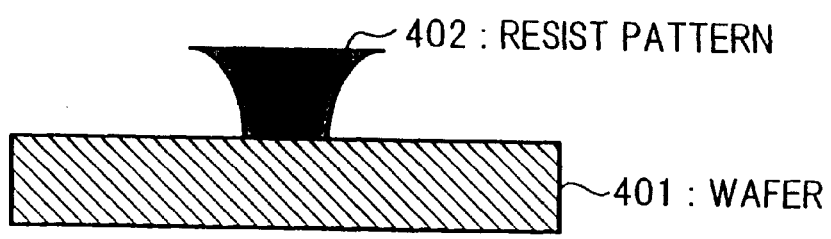
FIG. 4 is a cross section schematically illustrating a T-shaped resist pattern 402 developed on a wafer 401 with the comparison example.

The exposure dependence of resist solution speed of the comparison example is illustrated in a graphic chart of FIG. 3, showing more gentle gradient of the solubility characteristic than that of FIG. 1. FIG. 4 is a cross section schematically illustration a positive resist pattern 402 developed on a wafer 401, showing the T-shaped resist pattern degrading the resolution and the size accuracy.

As to a second example wherein only the PAG of the first example is replaced with diphenildisulphone, the same good result is obtained in the same way with the first example, which is the same in a third example wherein the base polymer is prepared with at mixture of polyhydroxystyrene polymers of molecular weight of 20,000 and 2,000, respectively, each having a THP protection group.

As heretofore described, with the chemically amplified resist according to the invention, T-shaped developed resist pattern can be prevented by suppressing generation of the surface insoluble layer owing to the acid-inactivation at the resist surface, realizing the good rectangular resist pattern stably and improving the size accuracy as well. Further, the resolution can be still improved by making sharp the gradient of solubility characteristic which is most important for the resolution.

Therefore, resolution, focusing and size accuracy of lithography can be improved according to the present invention, enabling still fine integration of the device pattern. In other words, the chemically amplified resist of the invention is very effective for configuring an ultra-fine pattern and makes a certain contribution to high performance or fine resolution of the lithography resist.

What is claimed is:

1. Chemically amplified resist comprising as its active material:
   (A) a first polyhydroxystyrene polymer having a t-butoxycarbonyl group and a photoacid generator, said first polyhydroxystyrene polymer having an average molecular weight between 8,000 and 30,000, wherein 25% to 45% of the hydroxyl groups of said first polyhydroxystyrene polymer are protected by said t-butoxycarbonyl group; and,
   (B) a second polyhydroxystyrene polymer having a t-butoxycarbonyl group, average molecular weight of the second polyhydroxystyrene polymer being equal to or greater than 400 and less than 6,000, wherein 25% to 45% of the hydroxyl groups of said second polyhydroxystyrene polymer are protected by said t-butoxycarbonyl group;
   wherein (a) the ratio of the average molecular weight of said first polyhydroxystyrene polymer and the average molecular weight of said second polyhydroxystyrene polymer is between 5:1 and 20:1, and (b) wherein 10 to 30 parts by weight of the second polyhydroxstyrene polymer is comprised for 100 parts by weight of the first polyhydroxstyrene polymer.

2. Chemically amplified resist comprising as its active material:
   (A) a first polyhydroxystyrene polymer group having a tetrahydropyranyl group and a photoacid generator, said first polyhydroxystyrene polymer having an average molecular weight between 8,000 and 30,000, wherein 25% to 45% of the hydroxyl groups of said first polyhydroxystyrene polymer are protected by said tetrahydropyranyl group; and,
   (B) a second polyhydroxystyrene polymer having a tetrahydropyranyl group, average molecular weight of the second polyhydroxystyrene polymer being equal to or greater than 400 and less than 6,000, wherein 25% to 45% of the hydroxyl groups of said second polyhydroxystyrene polymer are protected by said tetrahydropyranyl group;
   wherein (a) the ratio of the average molecular weight of said first polyhydroxystyrene polymer and the average molecular weight of said second polyhydroxystyrene polymer is between 5:1 and 20:1, and (b) wherein 10 to 30 parts by weight of the second polyhydroxystyrene polymer is comprised for 100 parts by weight of the first polyhydroxystyrene polymer.

* * * * *